United States Patent [19]

Barowski et al.

[11] 4,045,183
[45] Aug. 30, 1977

[54] SUPPORT DEVICE FOR USE IN A CRUCIBLE-FREE FLOATING ZONE MELTING APPARATUS

[75] Inventors: Gerhard Barowski; Wolfgang Keller; Gerhard Schröetter, all of Munich, Germany

[73] Assignee: Siemens Aktiengesellschaft, Berlin & Munich, Germany

[21] Appl. No.: 632,957

[22] Filed: Nov. 18, 1975

[30] Foreign Application Priority Data

Nov. 21, 1974 Germany .................. 2455173

[51] Int. Cl.² ............................. B01J 17/10
[52] U.S. Cl. .................. 23/273 SP; 156/620; 248/309 R; 269/237
[58] Field of Search ........... 23/273 SP, 273 Z, 273 R; 156/620, 617 SP, 617 R, 600; 248/309 R, 358 R, 94, 311.1, 314, 313; 269/237, 321 T; 13/13 ZM

[56] References Cited

U.S. PATENT DOCUMENTS

| 2,767,066 | 10/1956 | Zimmerman, Jr. | 23/252 R X |
| 2,917,286 | 12/1959 | Deakin | 248/314 X |
| 3,134,700 | 5/1964 | Sporrer | 156/620 |
| 3,211,881 | 10/1965 | Jablonski et al. | 23/273 Z |
| 3,592,611 | 7/1971 | Eder et al. | 23/273 Z |
| 3,923,468 | 12/1975 | Keller | 23/273 SP X |

FOREIGN PATENT DOCUMENTS 41-487  1/1966  Japan .................. 248/94

Primary Examiner—Norman Yudkoff
Assistant Examiner—Barry I. Hollander
Attorney, Agent, or Firm—Hill, Gross, Simpson, Van Santen, Steadman, Chiara & Simpson

[57] ABSTRACT

In an apparatus for crucible-free zone melting, a device for supporting a lower end of the crystalline rod of semiconductor which has a junction with a seed crystal characterized by the support device being formed by a plurality of sections or parts which are moveable relative to each other from a first position spaced or retracted from the seed crystal and the lower end of the rod to enable melting the rod adjacent to the junction and a second position forming a container surrounding the seed crystal and the lower end of the rod for receiving a supporting or stabilizing medium which dampens or prevents vibrations from being applied to the lower end of the rod and the junction. The sections are held in the second position by a holding means which may either be electromagnetic or mechanical.

17 Claims, 6 Drawing Figures

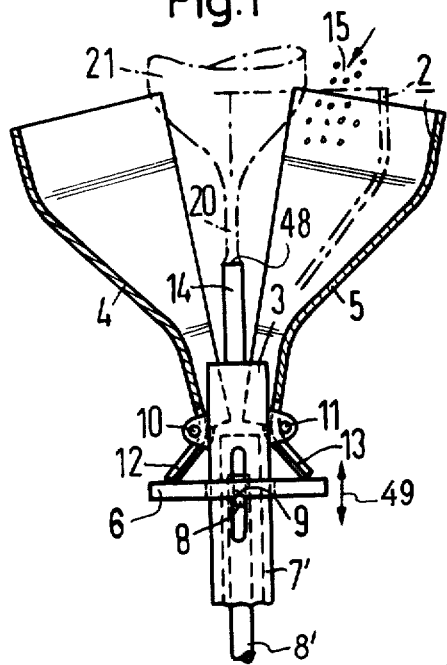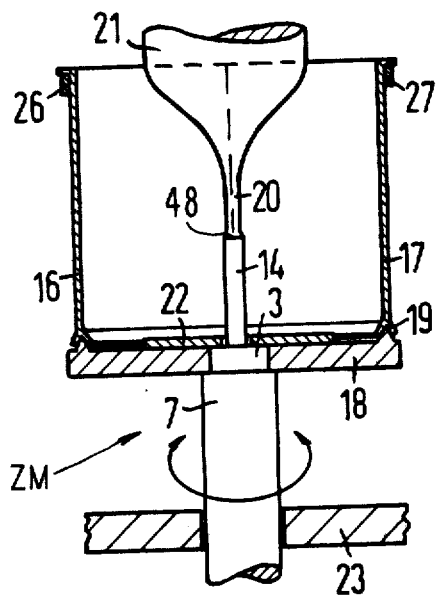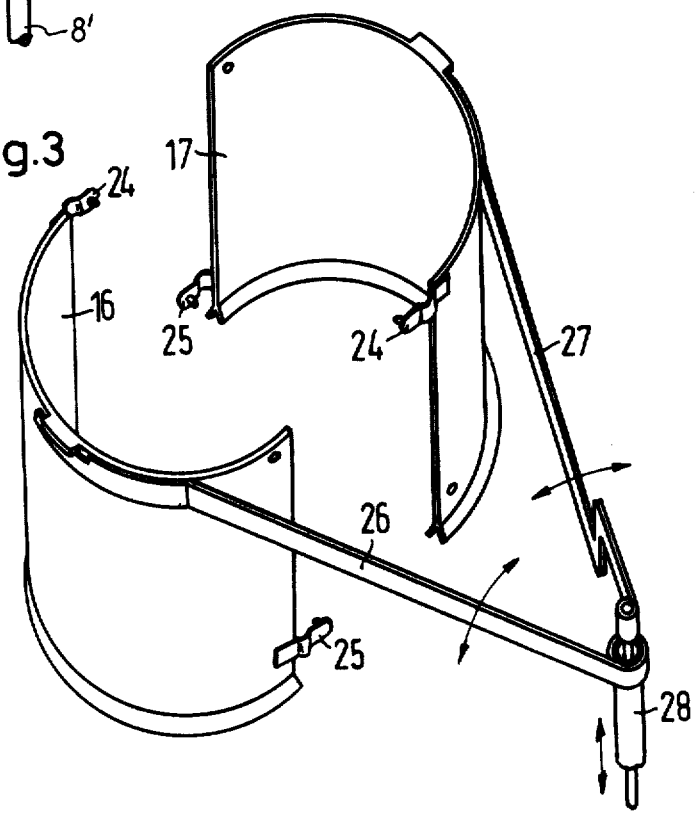

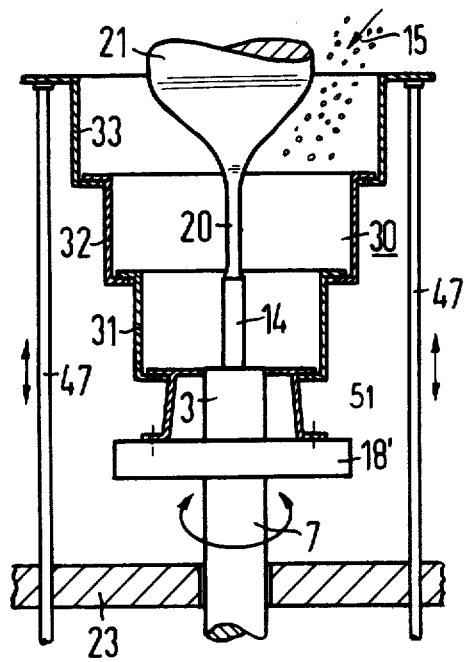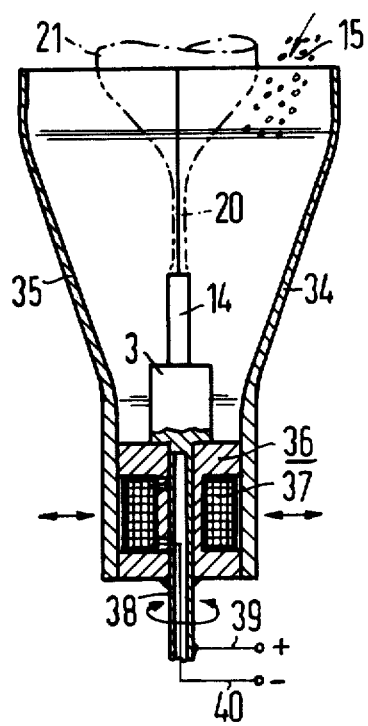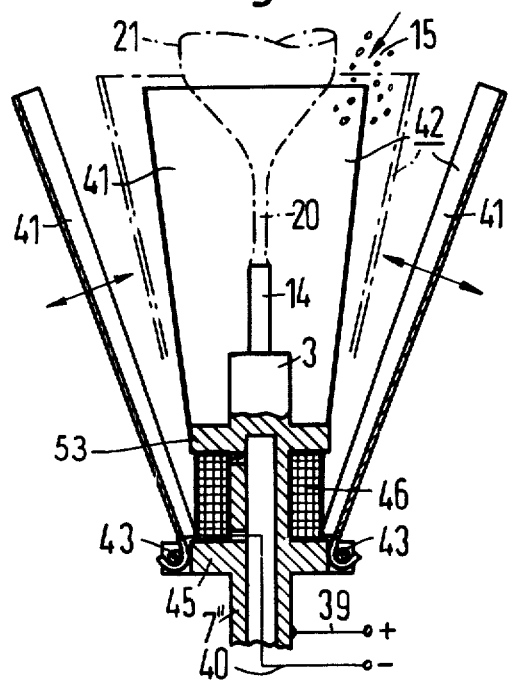

SUPPORT DEVICE FOR USE IN A CRUCIBLE-FREE FLOATING ZONE MELTING APPARATUS

BACKGROUND OF THE INVENTION

1. Field of the Invention

The present invention is directed to a device used in an apparatus for crucible-free zone melting of crystalline rods of semiconductor material which device forms a container surrounding the lower end of the rod for receiving a supporting or stabilizing material.

2. Prior Art

In Wolfgang Keller U.S. patent application, Ser. No. 525,641, filed on Nov. 20, 1974 which issued as U.S. Pat. No. 3,923,468, a method and apparatus for supporting a lower end of a crystalline rod of semiconductor material during a floating zone melting process was disclosed. As pointed out in the application, the crystalline rod of semiconductor material was provided at its lower end with a seed crystal which was joined thereto by a melted junction point or surface. The rod with the crystal was mounted in a vertical position in the zone melting apparatus by mounting means attached to each end with the seed crystal at the lower end. The mounting means could be rotated and were moveable axially relative to an annular induction heating coil so that a melting zone could be progressively moved axially along the crystalline rod to form a single crystal of semiconductor material. In this application, the supporting device comprised an axially moveable funnel-shaped shell which was mounted on the lower mounting means for rotatioon therewith. The funnel-shaped shell could be axially shifted from a position axially below the junction surface between the rod and the seed crystal to a position surrounding the seed crystal, the cone-shaped or drawn end and the lower portion of the rod after the zone melting had progressed axially therefrom.

As mentioned in the Keller application for rods of a length exceeding approximately 50 cm, as the floating zone melting proceeded away from the junction a given distance which depends on the diameter of the rod, vibrations would occur which would effect the zone melting process. The funnel-shaped shell formed a container which surrounded the junction of the rod to the seed crystal and the cone-shaped or conical portion of the rod adjacent the junction which is formed for the purpose of avoiding crystal displacements in the crystal being formed. The funnel-shaped shell or container which surrounded the rod of semiconductor material was moved axially on the lower mounting means for the rod by an external drive mechanism. In the method described in the application, before the melting zone had reached the distance from the junction surface of the seed crystal and the crystalline rod of semiconductor material which was critical in terms of the application of vibrations, the funnel-shaped container was moved axially upward to such an extent that it surrounded the junction surface, and surrounded a conical region of the crystalline rod adjacent to the juntion surface and was then filled with the stabilizing or supporting medium.

A difficulty with the above structure was that it required a larger amount of axial space for allowing movement of the funnel-shaped container from a retracted position exposing the junction to allow the beginning of the zone melting to the position which surrounded the junction and the adjacent bottleneck or conical portion of the rod. Since the zone melting processes are conducted in an enclosed air-tight chamber which enables either the conducting of the process in a vacuum or within a controlled atmosphere, this additional axial space required for the shifting of the conical container either reduced the length of a rod that could be processed or in the case of processing long crystalline rods of semiconductor material, required an elongated gas-tight chamber for conducting the process.

SUMMARY OF THE INVENTION

The present invention is directed to a device for use in an apparatus for crucible-free zone melting of a crystalline rod of semiconductor material which rod is vertically mounted in the apparatus by mounting means engaging each end of the rod with the lower end of the rod having a junction with a seed cyrstal, said device having a container attached for rotation with the lower mounting means and surrounding the lower end for receiving a stabilization medium to stabilize the lower end from vibrations with improvements comprising the container comprising a plurality of individual sections, said sectins being moveable relative to each other from a first position spaced or withdrawn from the seed crystal and the lower end of the rod to enable melting the rod adjacent to the junction to a position surrounding the seed crystal and the lower end of the rod, and means for holding the sections in said second position so that the container can receive a supporting or stabilizing medium to support the seed crystal and the end of the rod to reduce vibrations applied to the junction and an adjacent conical portion of the lower end of the rod. By the container being formed of sections which can be moved to a first position removed from the junction, the melting zone can be applied to the seed crystal and the rod adjacent thereto without interference from the container. However, prior to reaching a critical distance of the melting zone from the junction, the sections can be shifted and held in the second position to receive the stabilizing or supporting medium. In addition to providing space to enable a zone melting of the rod adjacent to the junction, the portion of the rod which is to be supported by the support medium will be sufficiently cooled after zone melting so that contact with the supporting medium will no longer cause any interference with the material of the rod.

BRIEF DESCRIPTION OF THE DRAWING

FIG. 1 is a partial cross section with portions in elevation of an embodiment of the device of the present invention;

FIG. 2 is a partial cross section of a second embodiment of the device of the present invention;

FIG. 3 is a perspective view of portions of the device of the second embodiment of the present invention;

FIG. 4 is a cross section with portions in elevation for purposes of illustration of a third embodiment of the present invention;

FIG. 5 is a cross section with portions in elevation for purposes of illustration of a fourth embodiment of the present invention; and FIG. 6 is a cross section with portions in elevation of a fifth embodiment of the present invention.

DESCRIPTION OF THE PREFERRED EMBODIMENTS

The principles of the present invention are particularly useful when incorporated in a device formed by a container 2 as illustrated in FIG. 1 which device is used in an apparatus which is partially illustrated and generally indicated at ZM in FIG. 2 and is for crucible-free zone melting of a crystalline rod of semiconductor material.

The apparatus ZM has mounting means for engaging each end of the rod of semiconductor material with only the lower mounting means 3 being illustrated. The mounting means holds the rod in a vertical position within a gas-tight chamber and preferably has a shaft 7 extending through a wall 23 of the chamber to enable rotation of the mounting means and rod within the chamber which will have a controlled atmosphere such as a vacuum. During a zone melting process, an induction heating device, not illustrated, is moved axially along the rod from a junction surface 48 which is formed by melting an end of the rod onto a crystal nucleus or seed crystal 14 to melt successive zones of the rod. Preferably, the rod is formed with a drawn or thin bottle-shaped portion 20 adjacent the junction surface 48 to eliminate the cause of crystal displacements. The bottleneck portion 20 is connected by a conical portion such as 21 to the full diameter of the rod.

In the embodiment of the device illustrated in FIG. 1, the container 2 has a funnel-shape and is formed of two titanium half shells 4 and 5 which are supported on the lower mounting means 3 by hinge or pivotable connections 10 and 11, respectively. To hold the sections 4 and 5 in a closed second position (illustrated in broken lines), a friction plate or cam ring 6 is axiallly received on a shaft portion 7' of the mounting means 3 for rotation therewith. The plate 6 which may be a steel plate is shifted axially in the direction of the arrow 49 by a pin 8 engaged in a recess or groove 9 in the bottom surface of the plate 6. As illustrated, the shaft portion 7' is hollow with the pin 8 extending through a slot and being carried by a shaft 8' which is received within the shaft 7'. When the pin 8 has been moved to its upper position, the friction plate 6 moves against projections or wings 12 and 13 of the sections 4 and 5, which projections form cam portions to pivot the sections on their hinge or pivot connections 10 and 11, respectively, to a closed or second position illustrated in broken lines. When the pin 8 is moved downward, the friction plate 6 is moved axially in the direction of the double arrow 49 to allow the sections 4 and 5 to swing on their pivot connections 10 and 11 to a spaced apart position which is clear of and spaced from both the rod of semiconductor material and the crystal nucleus 14. When in the spaced apart or first position, the induction heating ring can be moved into the vicinity of the junction surface 48 to start the zone melting process at or adjacent to the crystal nucleus 14.

When operating the device, the zone melting is started with the sections 4 and 5 in the first or spaced withdrawn position to enable melting the rod adjacent to the junction 48 and to form the bottleneck portion 20 and conical portion 21. After the induction heating ring is moved a sufficient distance away from the junction surface 48. The chamber or container 2 is filled with a stabilization or supporting medium 15, which may be sand, quartz, glass balls or metal balls and supports the lower end of the rod including the conical portion 21 to minimize the problems of vibrations which may occur during continued zone melting. It should be noted that the zone melting process will be conducted in a controlled atmosphere such as a vacuum or in an atmosphere of a given gas and all shafts such as 7 or 7' and other rods extending out of the chamber will be provided with appropriate seals which are not illustrated.

In the second embodiment illustrated in FIG. 2, similar parts are identified with the same element numbers. The container in the embodiment of FIG. 2 is formed by two half cylindrical shell portions 16 and 17, which are provided on a lower end with a groove that coacts with a concentrically spaced annular projection or ridge 19 on a ring plate 18 which is attached or fitted onto the lower end mounting means 3. As illustrated in FIG. 2, the sections 17 and 18 are in the second or closed position prior to being filled with the supporting medium. To prevent dripping of the semiconductor material onto the ring plate 18, which may be a steel plate, a modybdenum disc 22 is axially disposed around the crystal nucleus 14.

As best illustrated in FIG. 3, each of the sections 16 and 17 is provided with snap locks or spring locks 24 and 25 which have projections for engaging aligned apertures. The coaction of the locks 24 and 25 along with the coaction of the groove and projection 19 form means for holding the shells 16 and 17 in the second position which is coaxial with the crystal nucleus 14. As best illustrated in FIG. 3, each of the shells is supported on an arm 26 and 27, respectively, which arms are swivelable in an arcuate path relative to each other from a position with the shells spaced apart to the second position. The arms 26 and 27 are interconnected through a hollow, concentric shaft arrangement indicated at 28. After the shells 16 and 17 are moved to the second position and held in this position by the spring locks 24 and 25 and the coacting circular groove and projection or rib 19, the arms may be disconnected from the sections 16 and 17 and moved from the assembled container.

In FIG. 4, a third embodiment of the device is illustrated and utilizes a funnel-shaped container 30 which is formed by several cylindrical sections 31, 32 and 33 which are arranged in a telescopic manner. As illustrated, each of the sections 31, 32 and 33 have a radially outwardly extending flange at one end and a radially inwardly extending flange at the oppposite end so that when in the extended position, as illustrated, a funnel-shaped or conical container is formed. The lower section 31 engages a member 51 which is attached to a ring plate 18' which is attached on the mounting means 3 or the shaft 7 of the lower mounting means. To move the sections 31, 32 and 33 from a first position to the second position, external means such as rods 47 extend through a wall 23 of the chamber of the apparatus and are reciprocated in the direction of the arrows. When in the retracted or lower position, the sections 31, 32 and 33 will be concentrically arranged about the member 51 and enable movement of the induction heating coil into the vicinity of the seed crystal or crystal nucleus 14.

In FIG. 5, a fourth embodiment of the invention is illustrated and the device includes a pair of half shell members 34 and 35 which form the wall of the container. Each of the half shell members 34 and 35 is fabricated from a magnetic material such as steel. An electromagnet 36 which has a coil 37 is provided adjacent or beneath the seed crystal 14. As illustrated, the coil 36 has an axial passageway through which a hollow shaft 38 of the mounting means 3 extends. The magnet 36 has an upper shoulder or portion which forms a bottom wall of the container when the shells 34 and 35 are in the closed second position as illustrated. To apply current from the terminals such as 39 and 40, one lead extends through the hollow shaft 38 to the coil 37 with a gas-tight connection and the return is connected to the shaft 38 which is connected to the lead 39. The connections are of a known type which enable rotation of the shaft 38 during the zone melting operation. To enable cooling of the coil 37, a cooling system such as a flow of cooling fluid in the hollow shaft 38 can be utilized.

During zone melting processes, the shells are moved to a spaced apart position until the induction heating coil is moved a sufficient axial distance from the crystal nucleus 14. At this time, the coil is energized to hold the shells 34 and 35 on the magnet to form the container which receives the supporting or stabilizing medium 15.

Since the windings of the coil are provided with a lacquer insulation, and since the evacuation of the chamber of the apparatus may cause the insulation to release harmful vapors, the coil 37 is preferably encapsulated in silicone rubber. The coil 37 can also be soldered within a non-magnetic metal container in a gas-tight fashion. By encapsulating in silicone rubber or placing the coil in the non-magentic gas-tight container, the detrimental effect of any vapor is eliminated and the pumping period while placing the chamber of the apparatus in a vacuum does not become excessively long.

The fifth embodiment of the device of the present invention is illustrated in FIG. 6 and is similar to the embodiment illustrated in FIG. 5. In the fifth embodiment, the container is made up of a plurality of sheet iron sections 41 (such as four sections) which are each mounted by a pivotable or hinge connection 43 on an annular base plate 45 which is illustrated as a shoulder integral with a shaft 7". The mounting means 3 includes an axially displaced shoulder such as 53 which is illustrated as being integral with the mounting means. A coil 46 is disposed between the base plate 45 and the shoulder 53 is provided with suitable leads to terminals 39 and 40 of the power source as in the previously described embodiment. When the coil 46, which is encapsulated as the coil 37, is energized, the sections 41 move or swing on their pivots or hinges 43 to a closed second position engaging the periphery of the shoulder 53 which forms or seals the bottom of the container 42. When the coil 46 id de-energized, the sections 41 swing outward to provide sufficient clearance for the movement of the induction heating coil into the vicinity of the seed crystal or crystal nucleus 14.

Each of the illustrated embodiments of the device provide the possibility of fabricating silicon monocrystal rods which are completely free of dislocations and which rods are not only thick such as a diameter greater than 70mm but also are long rods with a length greater than 500 mm. Due to the simple construction of the various embodiments which use multiple section to form the container, it is possible to use the device in a presently available zone melting apparatus and to mount the device on presently available rod mounting means.

Although various minor modifications may be suggested by those versed in the art, it should be understood that we wish to employ within the scope of the patent granted hereon, all such modifications as reasonably and properly come within the scope of our contribution to the art.

We claim:

1. In an apparatus for crucible-free zone melting of a crystalline rod of semiconductor material which rod is vertically mounted in the apparatus by mounting means engaging each end of the rod with the lower end of the rod having a junction surface with a seed crystal, said apparatus having a container attached for rotation with the lower mounting means and surrounding said lower end for receiving a stabilization medium to support said lower end from vibration, the improvements comprising said container comprising a plurality of individual sections, said sections being moveable relative to each other from a first position spaced from the seed crystal and said lower end of the rod to enable melting of the rod adjacent to the junction surface to a second position forming the container and surrounding both the seed crystal and said lower end of the rod, and means for holding the sections in said second position so that the container can receive the stabilization medium to support the seed crystal and the end of the rod to reduce vibrations applied to the junction surface and an adjacent conical portion of the lower end of the rod.

2. In an apparatus according to claim 1, wherein said contaner has a funnel-shape and comprises two half shells, each of said shells being pivotably mounted on the lower mounting means to rotate therewith, said means for holding comprising a cam ring monted for axial movement on the lower mounting means, and means for shifting the cam ring axially on the lower mounting means between a lower position in which the shells are pivoted to the first position with the shells being spaced apart and an upper position wherein the cam ring engages cam portions of each shell to move the shells into the second position with the shells being closed together.

3. In an apparatus according to claim 2, wherein said half shells are titanium and said cam ring is steel.

4. In an apparatus according to claim 1, wherein the sections are half shells, and wherein the holding means includes a ring plate encircling the lower mounting means, said half shells and ring plate having a coacting annular groove and annular projection for holding the shells coaxially in said second position to form such container and the holding means including interlocks disposed on the half shells for holding the shells in said second position, said apparatus further including means engaging said shells for moving the half shells between the first position with the half shells disassembled from said ring plate and the second position assembled thereon.

5. In an apparatus according to claim 4, wherein the means for moving comprise a pair of swivel arms which are detachably connected to the half shells.

6. In an apparatus according to claim 4, in which said half shells are titanium and said ring plate is steel.

7. In an apparatus according to claim 1, wherein the plurality of sections comprise a plurality of cylindrical sections telescopically received within each other, said sections being concentrically disposed when in said first position and said means for holding comprising means shifting the sections to axially extend the sections to the second position with the shells forming the container surrounding the seed crystal and the lower end of the rod.

8. In an apparatus according to claim 7, wherein the smallest of the cylindrical sections is attached to a ring plate attached to the lower mounting means.

9. In an apparatus according to claim 8, wherein each of the sections of the container consists of titanium and the ring plate consists of steel.

10. In an apparatus according to claim 1, wherein each of the sections consist of a magnetic material and wherein the holding means comprises an electromagnet mounted on said lower mounting means, said electromagnet having a coil being separated from the junction surface by an annular shoulder forming a base wall of the container, so that application of a current to the coil causes the sections to be held on the annular shoulder in said second position.

11. In an apparatus according to claim 10, wherein the shaft of the mounting means is provided with means for cooling the coil.

12. In an apparatus according to claim 10, wherein the coil is encased in silicone rubber.

13. In an apparatus according to claim 12, wherein the shaft has means for cooling the coil.

14. In an apparatus according to claim 10, wherein the shaft is hollow and contains electrical leads for said coil.

15. In an apparatus according to claim 14, wherein the coil is encased in silicone rubber.

16. In an apparatus according to claim 15, wherein the hollow shaft of the lower mounting means includes means for cooling the interior of the coil.

17. In an apparatus according to claim 10, wherein each of the sections is mounted for pivotable movement to the lower mounting means immediately below said coil and wherein said sections consist of sheet iron.

* * * * *